United States Patent
Gschwind

(10) Patent No.: US 7,523,379 B1
(45) Date of Patent: Apr. 21, 2009

(54) METHOD FOR TIME-DELAYED DATA PROTECTION

(75) Inventor: Michael Karl Gschwind, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/060,228

(22) Filed: Mar. 31, 2008

(51) Int. Cl.
*H03M 13/00* (2006.01)

(52) U.S. Cl. .................. 714/758; 714/700; 714/701; 714/763; 714/774

(58) Field of Classification Search .......... 714/758, 714/799, 52, 700, 763, 774
See application file for complete search history.

(56) References Cited

U.S. PATENT DOCUMENTS

| | | | |
|---|---|---|---|
| 5,313,475 A | 5/1994 | Cromer et al. | 371/40.1 |
| 5,379,304 A | 1/1995 | Dell et al. | 371/40.1 |
| 5,450,422 A | 9/1995 | Dell | 371/40.1 |
| 5,754,567 A * | 5/1998 | Norman | 714/773 |
| 5,987,627 A | 11/1999 | Rawlings, III | 714/48 |
| 6,598,171 B1 * | 7/2003 | Farmwald et al. | 713/401 |
| 6,701,484 B1 | 3/2004 | Jordan et al. | 714/801 |
| 7,103,824 B2 * | 9/2006 | Halford | 714/759 |
| 7,143,332 B1 | 11/2006 | Trimberger | 714/763 |
| 2004/0237023 A1 | 11/2004 | Takahashi et al. | 714/768 |
| 2006/0156177 A1 * | 7/2006 | Kottapalli et al. | 714/758 |
| 2007/0022360 A1 * | 1/2007 | Rai et al. | 714/773 |
| 2007/0266298 A1 | 11/2007 | Hsieh et al. | 714/763 |
| 2008/0109687 A1 * | 5/2008 | Abernathy et al. | 714/704 |
| 2008/0155375 A1 * | 6/2008 | Vera et al. | 714/758 |

OTHER PUBLICATIONS

"Error Correction Codes" http://burtleburtle.net/bob/math/errorcor.html.
"The Error Correcting Codes (ECC) Page" http://www.eccpage.com/.
"ECC" http://searchnetworking.techtarget.com/sdefinition/0,,sid7_gci212028,00.html.
"ECC" (Rene Martinez, Jul. 26, 2001) http://searchnetworking.targeting.com/sDefinition/0..sid7_gci212028.00.html# .
"Error Correction Codes" (Bob Jenkins, Jul. 1, 1997) http://burtleburtle.net/bob/math/errorcor.html.
"The Error Correcting Codes (ECC) Page" (Christian Schuler, 1998 /Robert Morelos-Zaragoza, Aug. 6, 2008) http://www.eccpage.com/.

* cited by examiner

*Primary Examiner*—Esaw Abraham
(74) *Attorney, Agent, or Firm*—Zilka-Kotab, PC

(57) ABSTRACT

A method is provided for time-delayed data protection. During a writing operation, data is written to a register file, an error correction code is computed, and a delayed write of the error correction code to the register file is performed. Additionally, during a reading operation, data is read and if the error correction code is in the register file, the error correction code is read and the data is checked using the error correction code. If the error correction code is not in the register file, the data from the register is read without checking the data using the error correction code.

1 Claim, 1 Drawing Sheet

METHOD FOR TIME-DELAYED DATA PROTECTION

BACKGROUND

The present invention relates to data storage, and more particularly, this invention relates to ensuring the integrity of stored data.

Protecting data through the generation of data protection codes (e.g., parity, error correction code (ECC), etc.) has become increasingly necessary to protect against data errors. However, current design approaches penalize designs that provide data protection capabilities. For example, the delay incurred by generating protection codes may delay general data availability in current designs.

SUMMARY

A method is provided for time-delayed data protection. During a writing operation, data is written to a register file, an error correction code is computed, and a delayed write of the error correction code to the register file is performed. Additionally, during a reading operation, data is read and if the error correction code is in the register file, the error correction code is read and the data is checked using the error correction code. If the error correction code is not in the register file, the data from the register is read without checking the data using the error correction code.

Other aspects, advantages and embodiments of the present invention will become apparent from the following detailed description, which, when taken in conjunction with the drawings, illustrate by way of example the principles of the invention.

DETAILED DESCRIPTION

Figure 1:
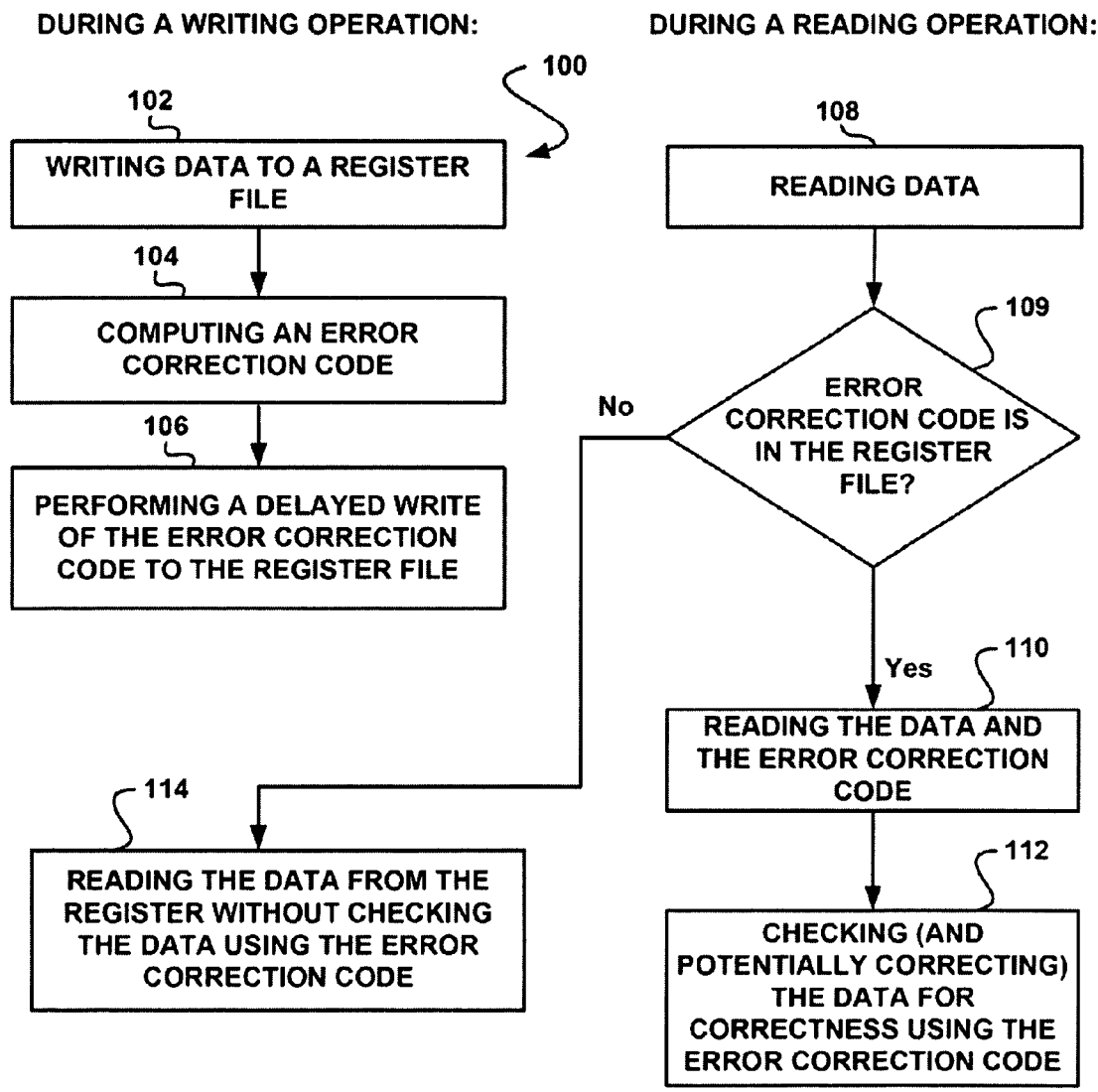
FIG. 1 is a method for time-delayed data protection according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

FIG. 1 illustrates a method 100 for time-delayed data protection, which may be employed in the context of the present invention. As shown, during a writing operation, in operation 102, data is written to a register file. Additionally, during the writing operation, in operation 104, an error correction code is computed. In the context of the present description, error correction code refers to any correction code with a correction capability. Additionally, in one embodiment, a detection code may be used in place of correction code. In this case, when an error is detected, an error may be indicated instead of correcting the error.

As shown further, during the writing operation, in operation 106, a delayed write of the error correction code to the register file is performed. Further still, during a reading operation, in operation 108, data is read. Also, during the reading operation, it is determined whether the error correction code is in the register file. See operation 109. If it is determined that the error correction code is in the register file, in operation 110, the data and the error correction code are read. In operation 112, the data is checked for correctness using the error correction code. Further, in the case that the data is not correct, any corrections may be implemented. In addition, during the reading operation, if it is determined the error correction code is not in the register file, in operation 114 the data is read from the register without checking the data using the error correction code.

In one embodiment, the error correction code may be computed inside a logic block encompassing the register file. In another embodiment, the computing of the error correction code and the performing of the delayed write of the error correction code may be included in the design of the register file. In still another embodiment, the computing of the error correction code and the performing of the delayed write of the error correction code may be included in a separate level incorporating error correction code logic and storage.

In another embodiment, before the completion of the delayed write, it may be indicated that the error correction code is not available in order to suppress error correction code checking when the error correction code is not yet in the register file.

In this way, register files containing storage cells with time-delayed (skewed) write-back functionality may allow immediate write-back of data to register files, while accommodating the extra delay involved in generating protection codes. Thus, no delay for determining an error is necessary because the error correction code may be read simultaneously when it is available. As an option, a computed error correction code may be bypassed and used in conjunction with data that has been read (and not bypassed) from the register file.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
during a writing operation:
 writing data to a register file, the register file includes storage cells with time delayed write back functionality;
 computing an error correction code;
 performing a delayed write of the error correction code to the register file to suppress the error correction code when the error correction code is not yet in the register file;
during a reading operation:
 reading data;
 if the error correction code is in the register file:
  reading the error correction code; and
  checking the data using the error correction code;
 if the error correction code is not in the register file:
  reading the data from the register without checking the data using the error correction code.

* * * * *